(12) United States Patent  (10) Patent No.: US 6,518,633 B2
Mori et al.                      (45) Date of Patent:    Feb. 11, 2003

(54) SEMICONDUCTOR DEVICE AND METHOD FOR MANUFACTURING THE SAME

(75) Inventors: Katsumi Mori, Sakata (JP); Kenji Kojima, Sapporo (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 09/773,779

(22) Filed: Feb. 2, 2001

(65) Prior Publication Data

US 2001/0017394 A1 Aug. 30, 2001

(30) Foreign Application Priority Data

Feb. 3, 2000 (JP) ........................................ 2000-026369

(51) Int. Cl.[7] .......................... H01L 29/76; H01L 29/94; H01L 31/062; H01L 31/113; H01L 31/119
(52) U.S. Cl. ........................................ 257/396; 257/510
(58) Field of Search ............................... 257/396, 506, 257/510, 678, 777, 778

(56) References Cited

U.S. PATENT DOCUMENTS 5,804,491 A  * 9/1998 Ahn ........................... 438/425
5,851,899 A  * 12/1998 Weigand ...................... 438/427
6,033,959 A  *  3/2000 Fu .............................. 438/289
6,331,469 B1 * 12/2001 Park et al. ................... 438/296

* cited by examiner

*Primary Examiner*—David Nelms
*Assistant Examiner*—David Nhu
(74) *Attorney, Agent, or Firm*—Harness, Dickey & Pierce, P.L.C.

(57) ABSTRACT

A semiconductor wafer 10 has a chip region 20 and a non-chip region 22. Dummy trench isolation regions 40 are formed in at least a part of the non-chip region 22 of the semiconductor wafer 10. The dummy trench isolation regions 40 are formed in a region extending by a specified distance D10 into the non-chip region 22 from a boundary between the chip region 20 and the non-chip region 22. A method is also provided for processing a semiconductor wafer 10 having a chip region 20 and a non-chip region 22. The method includes a process for forming trench isolation regions in the semiconductor wafer 10. The process includes the steps of forming dummy trench isolation regions 40 in at least a part of the non-chip region 22 of the semiconductor wafer 10, wherein the dummy trench isolation regions 40 are formed in a region extending by a specified distance D10 into the non-chip region 22 from a boundary between the chip region 20 and the non-chip region 22.

6 Claims, 14 Drawing Sheets

Fig. 14 (a) (Prior Art)
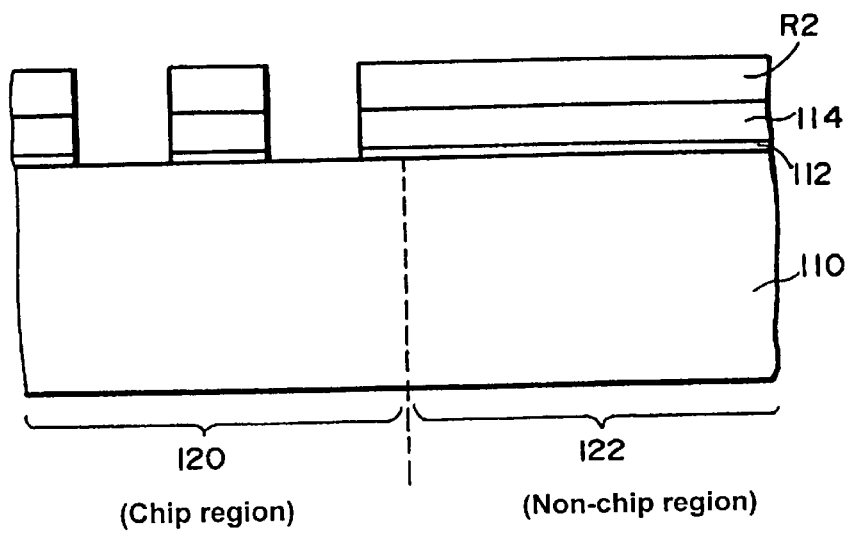
Fig. 14 (b) (Prior Art)
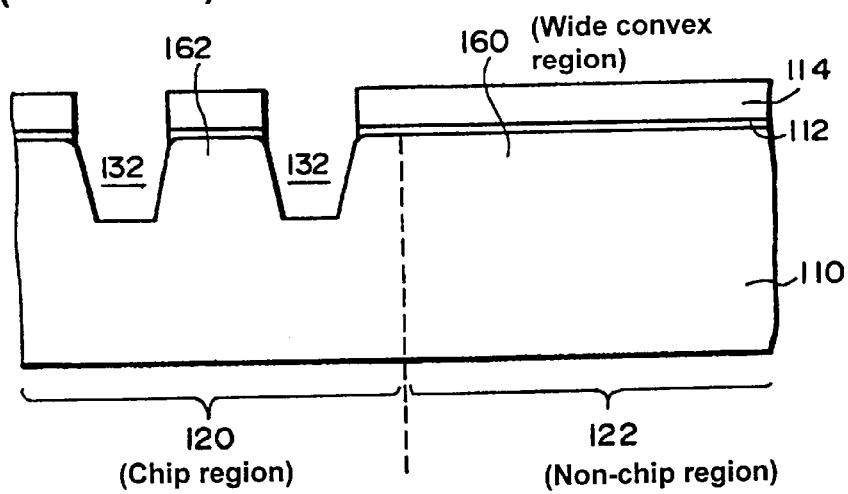

Fig. 15 (a) (Prior Art)
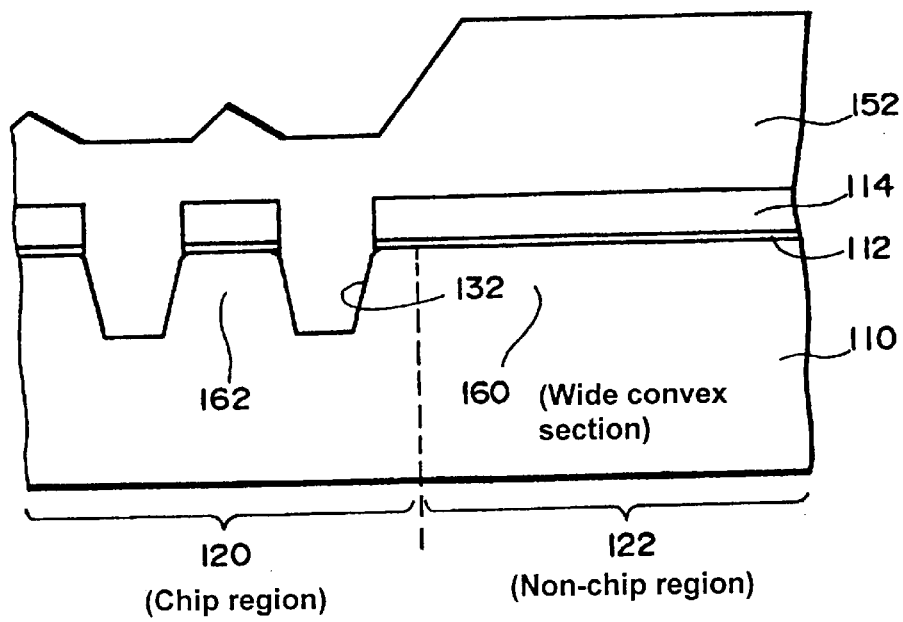
Fig. 15 (b) (Prior Art)
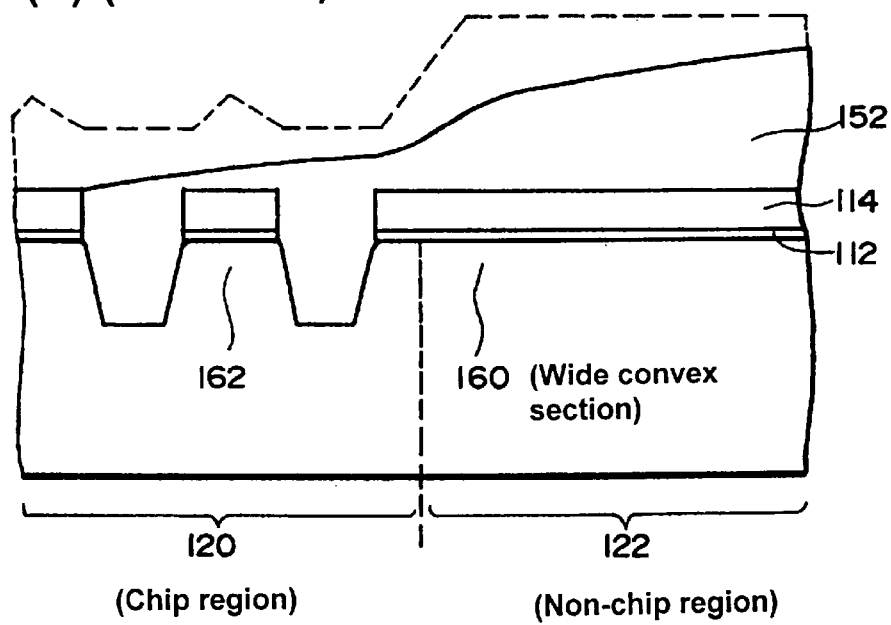

SEMICONDUCTOR DEVICE AND METHOD FOR MANUFACTURING THE SAME

TECHNICAL FIELD

The present invention relates to a semiconductor device and a method for manufacturing the same, and more particularly to a semiconductor device having an element isolation region and a method for manufacturing the same.

BACKGROUND

With the miniaturization of semiconductor devices (for example, MOS transistors) promoted in recent years, a further miniaturization of element isolation regions in semiconductor devices is required. In order to achieve a further miniaturization of element isolation regions in semiconductor devices, a trench isolation technique has been introduced. In the trench isolation technique, trenches are provided between semiconductor elements over a semiconductor substrate, and a dielectric material is filled in the trenches to isolate the semiconductor elements from one another. One example of the element isolation technique will be described below.

FIGS. 13 through 15 schematically show steps of forming element isolation regions using a conventional trench isolation technique. FIG. 13 is a plan view of a semiconductor wafer over which a pad layer, a polishing stopper layer and a resist layer are successively deposited. FIG. 13 also shows, for description purposes, a range of exposure of the resist layer formed over the semiconductor wafer. FIGS. 14 and 15 schematically show cross-sectional views taken along a line B—B of FIG. 13 in different steps.

First, a pad layer 112, a polishing stopper layer 114 and a resist layer R2 are successively deposited over a semiconductor wafer 110. Then, as shown in FIG. 13, the resist layer R2 only in a chip region 120 is exposed.

Next, as shown in FIG. 14(a), the resist layer R2 is developed to form the resist layer R2 into a specified pattern. Then, the polishing stopper layer 114 and the pad layer 112 are removed using the resist layer R2 as a mask.

Then, as shown in FIG. 14(b), the resist layer R2 is removed and then trenches 132 are formed in the semiconductor wafer 110 using the polishing stopper layer 114 as a mask.

Then, as shown in FIG. 15(a), a dielectric layer 152 is formed over the semiconductor wafer 110 in a manner to fill the trenches 132 with the dielectric layer 152.

Next, as shown in FIG. 15(b), the dielectric layer 152 is polished by a chemical-mechanical polishing method (hereafter referred to as a "CMP method"). Through the steps described above, the dielectric layer 152 is embedded in the trenches 132, and thereby trench isolation regions are formed.

In view of preventing the throughput of the exposure step from lowering, the resist layer R2 in the non-chip region 122 is not generally exposed, as shown in FIG. 13. As a result, as shown in FIG. 14(b), after the trenches 132 are formed in the semiconductor wafer 110, a relatively wide convex region 160 is formed in the non-chip region 122 adjacent to the chip region 120. The relatively wide convex region 160 formed in the non-chip region 122 adjacent to the chip region 120 causes the following problems.

As shown in FIG. 15(a), when the dielectric layer 152 is formed over the semiconductor wafer 110, the dielectric layer 152 is thickly deposited over the wide convex region 160. If the dielectric layer 152 is polished while the dielectric layer 152 is thickly deposited in the wide convex region 160, the dielectric layer 152 deposited in the wide convex region 160 remains when the polishing of the dielectric layer 152 deposited over the chip region 120 is completed, as shown in FIG. 15(b). Also, due to the presence of the thick dielectric layer 152 formed in the wide convex region 160, the dielectric layer 152 remains in an area over a convex section 162 adjacent to the wide convex region 160. In other word, the dielectric layer 152 in the chip region 120 remains in an area over the convex section 162 adjacent to the non-chip region 122. When the dielectric layer 152 in the chip region 120 remains in an area over the convex section 162 adjacent to the non-chip region 122, the polishing stopper layer 114 cannot be removed, and a element cannot be formed over the convex section 162.

Furthermore, if the dielectric layer 152 is polished while the dielectric layer 152 is thickly deposited in the wide convex region 160, thinning and dishing phenomenon occur. These phenomenon cause variations in the thickness of the dielectric layer 152.

Because of the reasons described above, when the relatively wide convex region 160 is formed in the non-chip region 122 adjacent to the chip region 120, chips that are formed in outermost areas (areas indicated by crosses (x) in FIG. 13) of the chip region 120 may become bad chips. In other words, the yield of chips formed in the chip region other than the outermost areas is lowered.

SUMMARY

It is an object of the present invention to provide semiconductor wafers, a method for processing the same and a method for manufacturing semiconductor devices, which improve the yield of chips formed in a chip region other than outermost areas of the chip region.

(1) In accordance with a first embodiment of the present invention, a method is provided for processing a semiconductor wafer having a chip region and a non-chip region. In accordance with the method, trench isolation regions are formed in the semiconductor wafer, and dummy trench isolation regions are formed in at least a part of the non-chip region of the semiconductor wafer, wherein the dummy trench isolation regions are formed in a region extending by a specified distance into the non-chip region from a boundary between the chip region and the non-chip region.

The "chip region" used here refers to a region in a semiconductor wafer where chips can be formed according to a given pattern, and the "non-chip region" used here refers to a region in the semiconductor wafer where chips cannot be formed according to the given pattern.

In the method for processing a semiconductor wafer in accordance with the first embodiment, dummy trench isolation regions are formed in at least a part of the non-chip region of the semiconductor wafer. In other words, when trenches are formed in the semiconductor wafer to form trench isolation regions in the semiconductor wafer, dummy trenches are formed in the non-chip region. As a result, when a dielectric layer is filled in the trenches, the dielectric layer is prevented from being thickly deposited in a convex region in the non-chip region. Therefore, after the dielectric layer is polished, the dielectric layer is prevented from remaining in convex sections in the chip region adjacent to the non-chip region by the influence of the dielectric layer deposited over the non-chip region. As a result, the yield of chips to be formed in the chip region adjacent to the non-chip region is increased.

The specified distance may preferably be 1.5 mm or greater. When the specified distance is 1.5 mm or greater, the dielectric layer is prevented from remaining over convex sections in the chip region adjacent to the non-chip region.

More preferably, the specified distance may be between 2 mm and 5 mm. When the specified distance is 2 mm or greater, the dielectric layer can be more securely prevented from remaining over convex sections in the chip region adjacent to the non-chip region. Also, when the specified distance is 5 mm or smaller, the chip region can be more effectively defined over the semiconductor wafer.

(2) In accordance with a second embodiment of the present invention, a method is provided for processing a semiconductor wafer having a chip region and a non-chip region. In accordance with the method, the method comprises step (A) of forming trench isolation regions in the semiconductor wafer, wherein step (A) comprises the steps of:

(a) forming a polishing stopper layer having a specified pattern over the semiconductor wafer;

(b) forming trenches in the chip region and dummy trenches in at least a portion of the non-chip region in the semiconductor wafer using at least the polishing stopper layer as a mask, wherein the dummy trench isolation regions are formed in a region extending by a specified distance into the non-chip region from a boundary between the chip region and the non-chip region;

(c) forming a dielectric layer over the semiconductor wafer and filling the trenches and the dummy trenches with the dielectric layer; and (d) polishing the insulation layer using the polishing stopper layer as a stopper.

A method for processing a semiconductor wafer in accordance with the second embodiment of the present invention can provide the same effects as those provided by the method for processing a semiconductor wafer in accordance with the first embodiment of the present invention.

The specified distance may preferably be 1.5 mm or greater in step (b). When the specified distance may preferably be 1.5 mm or greater, the dielectric layer is prevented from remaining over convex sections in the chip region adjacent to the non-chip region.

More preferably, the specified distance may be between 2 mm and 5 mm in step (b). When the specified distance is 2 mm or greater, the dielectric layer can be more securely prevented from remaining over convex sections in the chip region adjacent to the non-chip region. Also, when the specified distance is 5 mm or smaller, the chip region can be more effectively defined over the semiconductor wafer.

In accordance with a third embodiment of the present invention, a method is provided for processing a semiconductor wafer having a chip region and a non-chip region. In accordance with the method, the method comprises step (A) of forming trench isolation regions in the semiconductor wafer, wherein step (A) comprises the steps of:

(h) forming a polishing stopper layer over the semiconductor wafer;

(i) forming a resist layer over the polishing stopper layer;

(j) exposing the resist layer in the chip region and at least one specified portion of the non-chip region, wherein the resist layer is exposed in a region extending by a specified distance into the non-chip region from a boundary between the chip region and the non-chip region;

(k) developing the resist layer;

(l) removing the polishing stopper layer in a specified pattern using the resist layer as a mask;

(m) etching the semiconductor wafer using at least the polishing stopper layer as a mask to form trenches in the chip region and dummy trenches in the non-chip region;

(n) forming a dielectric layer over the semiconductor wafer and filling the trenches and the dummy trenches with the dielectric layer; and (o) polishing the dielectric layer using the polishing stopper layer as a stopper.

A method for processing a semiconductor wafer in accordance with the third embodiment of the present invention can provide the same effects as those provided by the method for processing a semiconductor wafer in accordance with the first embodiment of the present invention.

The specified distance may preferably be 1.5 mm or greater in step (j). When the specified distance may preferably be 1.5 mm or greater, the dielectric layer is prevented from remaining over convex sections in the chip region adjacent to the non-chip region.

More preferably, the specified distance may be between 2 mm and 5 mm in step (j). When the specified distance is 2 mm or greater, the dielectric layer can be more securely prevented from remaining over convex sections in the chip region adjacent to the non-chip region. Also, when the specified distance is 5 mm or smaller, the chip region can be more effectively defined over the semiconductor wafer.

In accordance with another embodiment of the present invention, a semiconductor wafer has a chip region and a non-chip region, wherein the semiconductor wafer comprises dummy trench isolation regions in at least a part of the non-chip region. In one aspect, the dummy trench isolation regions are formed in a region extending by a specified distance into the non-chip region from a boundary between the chip region and the non-chip region.

When semiconductor devices are manufactured using a semiconductor wafer manufactured in accordance with the present invention, the yield of chips to be formed in the chip region adjacent to the non-chip region is increased for the same reasons described above in connection with the methods for processing semiconductor wafers.

In one aspect of the present invention, the specified distance may preferably be 1.5 mm or greater. When the specified distance is 1.5 mm or greater, the dielectric layer is prevented from remaining over convex sections in the chip region adjacent to the non-chip region.

More preferably, the specified distance may be between 2 mm and 5 mm. When the specified distance is 2 mm or greater, the dielectric layer can be more securely prevented from remaining over convex sections in the chip region adjacent to the non-chip region. Also, when the specified distance is 5 mm or smaller, the chip region can be more effectively defined over the semiconductor wafer.

In accordance with still another embodiment of the present invention, a method for manufacturing a semiconductor device includes a method for processing a semiconductor wafer according to any one of claims 1 through 9.

By the method for manufacturing a semiconductor device in accordance with the present invention, the yield of chips to be formed in the chip region adjacent to the non-chip region is increased for the same reasons described above in connection with the methods for processing semiconductor wafers.

Other features and advantages of the invention will be apparent from the following detailed description, taken in conjunction with the accompanying drawings that illustrate, by way of example, various features of embodiments of the invention.

BRIEF DESCRIPTION OF THE DRAWINGS

FIGS. 14(a) and 14(b) schematically show cross-sectional views of an element isolation region in different forming steps of a conventional trench isolation technique.

FIGS. 15(a) and 15(b) schematically show cross-sectional views of an element isolation region in different forming steps of a conventional trench isolation technique.

DETAILED DESCRIPTION

Preferred embodiments are described with reference to the accompanying drawings.

Figure 1:
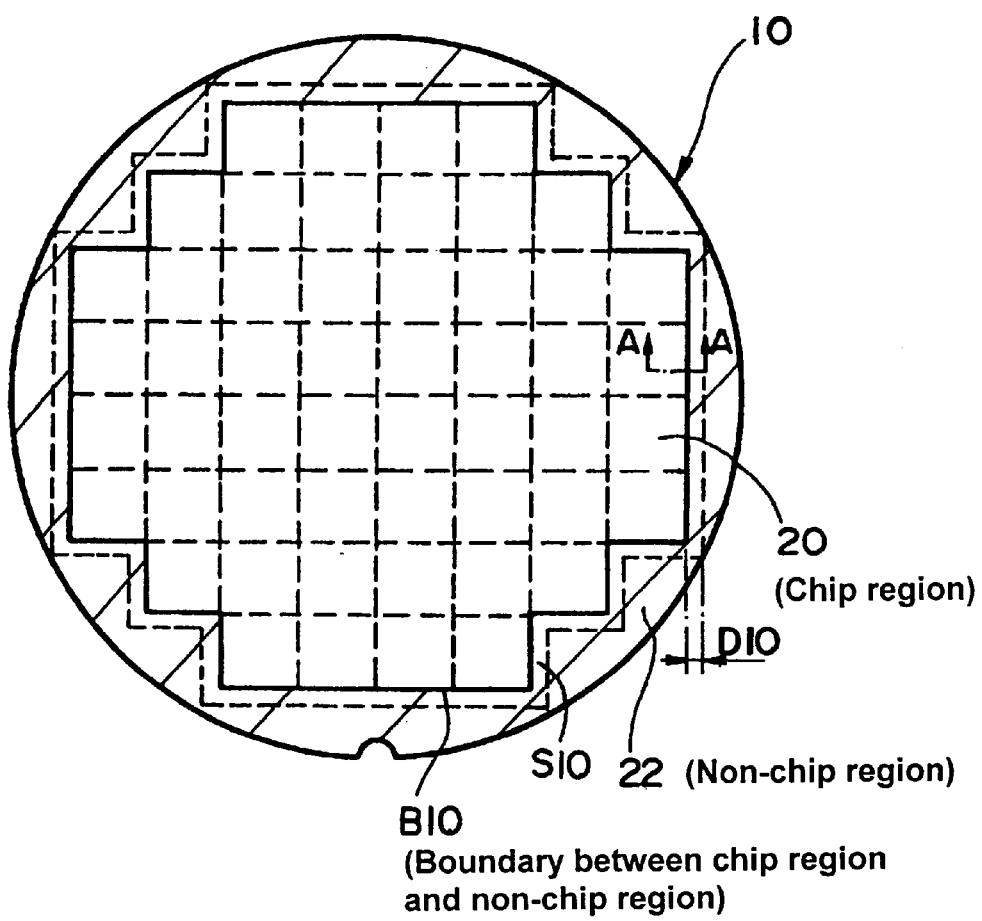
FIG. 1 schematically shows a plan view of a semiconductor wafer.
Figure 2:
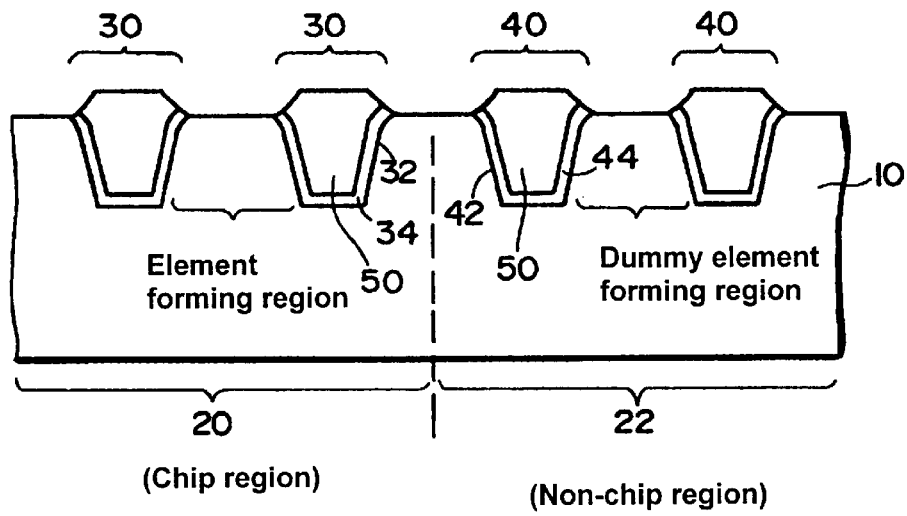
FIG. 2 shows a cross-sectional view taken along a line A—A of FIG. 1.

A semiconductor wafer in accordance with one embodiment of the present invention is described below. FIG. 1 schematically shows a plan view of a semiconductor wafer 10. FIG. 2 shows a cross-sectional view taken along a line A—A of FIG. 1.

The semiconductor wafer 10 is subject to certain process steps, and has the following structure. The semiconductor wafer 10 has a chip region 20 and a non-chip region 22 (that is indicated by hatching in FIG. 1). The "chip region 20" used here refers to a region in the semiconductor wafer 10 where chips can be formed according to a given pattern. The "non-chip region 22" used here refers to a region in the semiconductor wafer 10 where chips cannot be formed according to the given pattern.

As shown in FIG. 2, trench isolation regions 30 are formed at specified locations in the chip region 20 of the semiconductor wafer 10. Dummy trench isolation regions 40 are formed in the non-chip region 22 of the semiconductor wafer 10. The dummy trench isolation regions 40 are formed within a region S10 that extends from a boundary B10 between the chip region 20 and the non-chip region 22 by a specified distance D10 into the non-chip region 22. (In other words, the region S10 is defined by a region between the boundary line of the chip region and the non-chip region and a broken line shown in FIG. 1). The specified distance D10 may preferably be 1.5 mm or greater, and more preferably be 2 mm through 5 mm.

The trench isolation regions 30 isolate element-forming regions from one another to define the element forming regions. The trench isolation regions 30 are formed from trench dielectric layers 50 in trenches 32 that are formed in the semiconductor wafer 10. Trench oxide layers 34 are interposed between the semiconductor wafer 10 and the trench dielectric layers 50.

The dummy trench isolation regions 40 define dummy element-forming regions. The dummy trench isolation regions 40 have the same structure as that of the trench isolation regions 30. In one embodiment, the dummy trench isolation regions 40 are formed from trench dielectric layers 50 in dummy trenches 42 that are formed in the semiconductor wafer 10. Trench oxide layers 44 are interposed between the semiconductor wafer 10 and the trench dielectric layers 50.

A method for processing a semiconductor wafer in accordance with one embodiment of the present invention is described below. More specifically, a method for forming trench isolation regions in a semiconductor wafer is described. FIGS. 3 and 7 through 10 schematically show cross-sectional views of a semiconductor wafer in different processing steps in accordance with one embodiment of the present invention.

Figure 3:
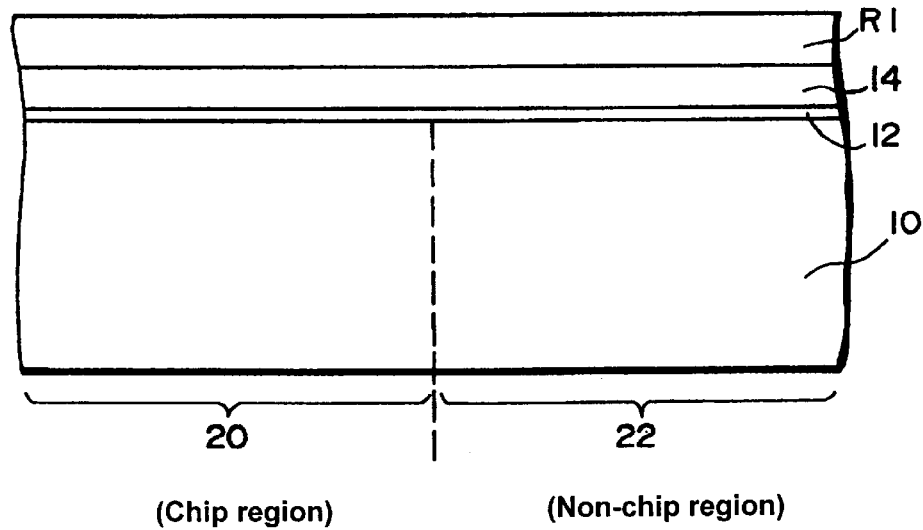
FIG. 3 schematically shows a cross-sectional view of a semiconductor wafer in a semiconductor wafer process step in accordance with one embodiment of the present invention.

(1) Referring to FIG. 3, a pad layer 12 is formed over a semiconductor substrate 10. The pad layer 12 may be formed from, for example, a silicon oxide, a silicon oxide nitride, and the like. When the pad layer 12 is formed from a silicon oxide, the pad layer 12 may be formed by a thermal oxidation method or a CVD method. When the pad layer 12 is formed from a silicon oxide nitride, the pad layer 12 may be formed by a CVD method. The thickness of the pad layer 12 is, for example, 5–20 nm.

Next, a polishing stopper layer 14 is formed over the pad layer 12. The polishing stopper layer 14 may have a single-layer structure or a multiple-layer structure. As a single-layer structure, any one of a silicon nitride layer, a polycrystal silicon layer and an amorphous silicon layer can be used. A multiple-layer structure may be formed from at least two layers selected from a silicon nitride layer, a polysilicon layer and an amorphous silicon layer. The polishing stopper layer 14 can be formed by a known method such as a CVD method. The polishing stopper layer 14 has a thickness that sufficiently functions as a stopper in a step polishing a dielectric layer to be performed later, for example, a thickness of about 50–250 nm.

Then, a resist layer R1 is coated over the polishing stopper layer 14 by a known method.

Figure 4:
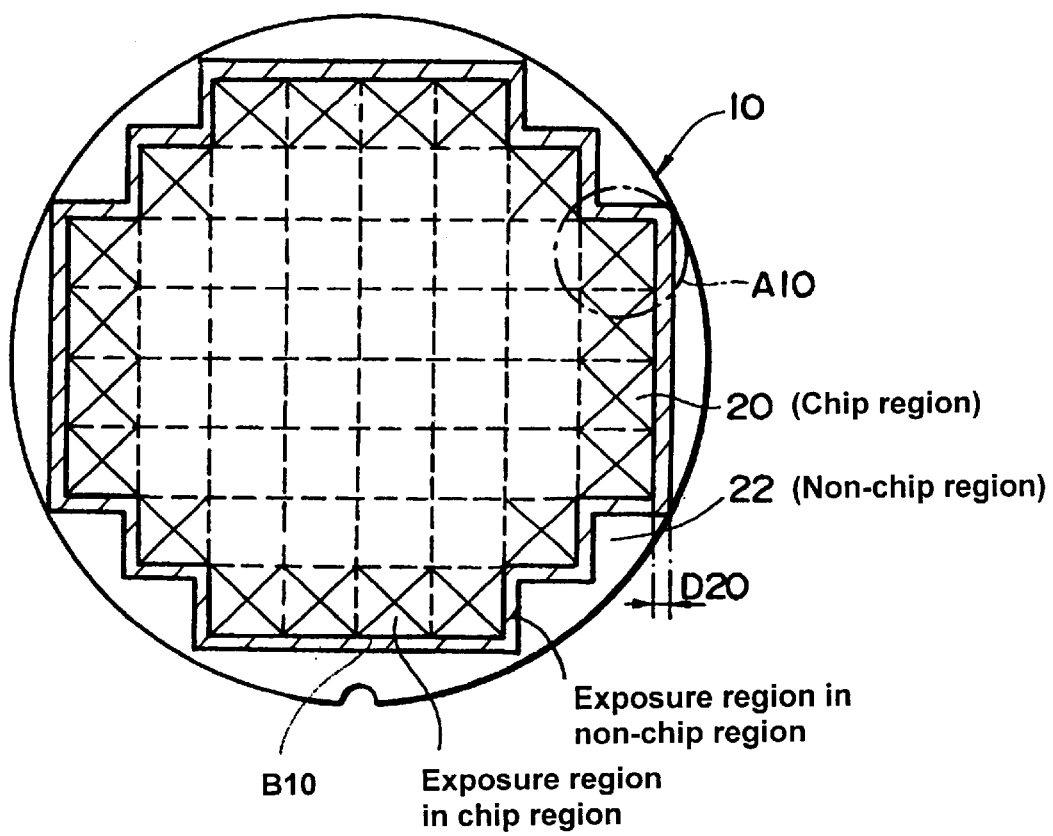
FIG. 4 shows a plan view of a semiconductor wafer for describing regions to be exposed.

(2) Next, as shown in FIG. 4, the resist layer R1 is exposed. FIG. 4 shows an area to be exposed in the semiconductor wafer 10.

In the exposure step, not only the chip region 20 but also the non-chip region 22 are exposed. The chip region 20 and the non-chip region 22 are exposed in a manner described below.

The chip region 20 may be exposed by any known method. For example, when light is used to expose the chip region 20, a method using a reduction-projection exposure apparatus or a method using a 1:1 projection exposure apparatus may be used. When electron beam is used to expose the chip region 20, a method using a direct drawing method can be used. The method using a reduction-projection exposure apparatus may preferably be conducted by a step-and-repeat method or a step-and-scan method.

The exposure is performed over the non-chip region 22 to form dummy trenches 42 (to be described below) in the non-chip region 22. The exposure on the non-chip region 22 is conducted within a region that extends from a boundary B10 between the chip region 20 and the non-chip region 22 by a specified distance D20 into the non-chip region 22 (i.e., a hatched region shown in FIG. 4). The specified distance D20 may preferably be 1.5 mm or greater, and more preferably be 2 mm through 5 mm.

The non-chip region 22 may be exposed by any method and is not limited to any specific method as long as the non-chip region 22 is exposed. For example, when light is used to expose the non-chip region 22, a method using a reduction-projection exposure apparatus or a method using a 1:1 projection exposure apparatus may be used. When electron beam is used to expose the non-chip region 22, a method using a direct drawing method can be used. The method using a reduction-projection exposure apparatus may preferably be conducted by a step-and-repeat method or a step-and-scan method. Also, the non-chip region 22 may preferably be exposed by the same exposure method used for exposing the chip region 20, in view of improving the throughput of the exposure step.

Figure 5:
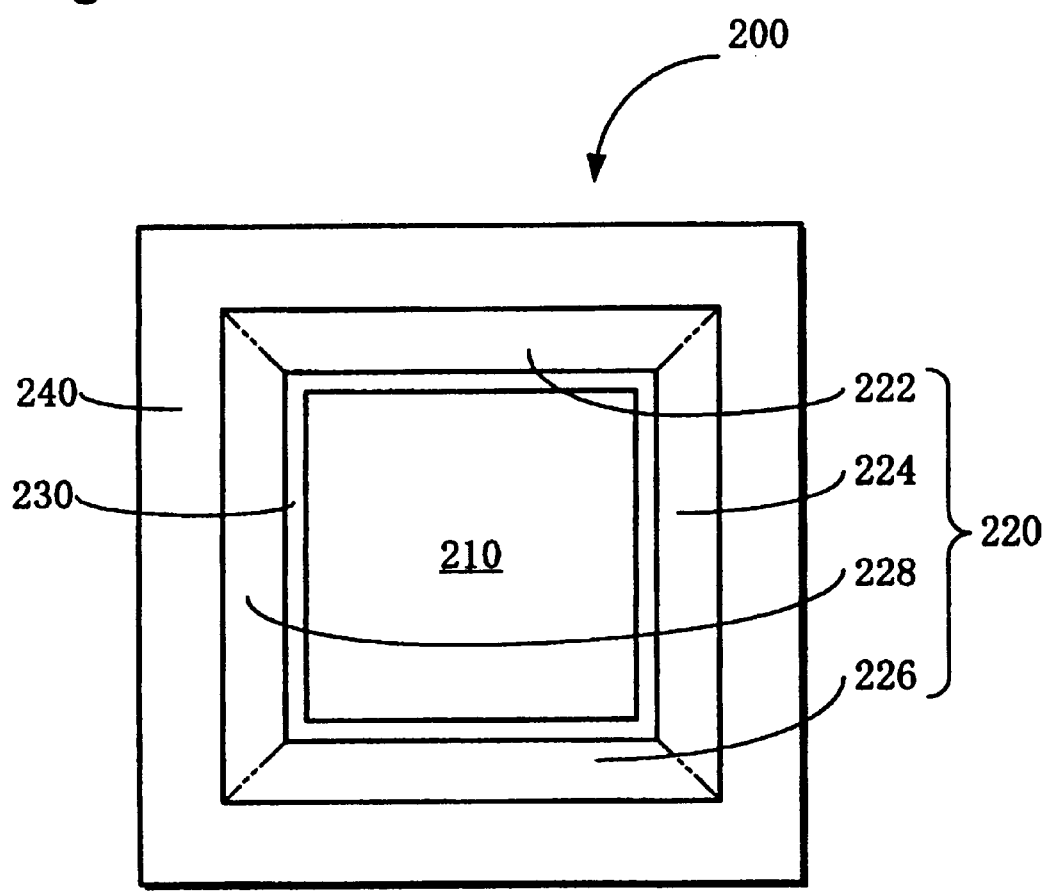
FIG. 5 schematically shows a plan view of a photomask.

Any photomask may be used for exposing the non-chip region 22 as long as the dummy trenches 42 can be formed in the non-chip region 22. A common photomask used for exposing the chip region 20 may be used for exposing the non-chip region 22. Alternatively, different photomasks may be used for exposing the chip region 20 and for exposing the non-chip region 22, respectively. In view of improvement in the throughput in the exposure step, a common photomask may be used both for exposing the chip region 20 and for exposing the non-chip region 22. When the same photomask is used for exposing the chip region and for exposing the non-chip region, a photomask 200 that is schematically shown in FIG. 5 may preferably be used. The photomask 200 is described below.

The photomask 200 has an effective pattern region 210 and a dummy pattern region 220. The dummy pattern region 220 is formed around the effective pattern region 210. The dummy pattern 220 includes first through fourth dummy pattern sections 222, 224, 226 and 228 that are formed along peripheral edges of the effective pattern region 210, respectively. A first shading band 230 is formed between the effective pattern region 210 and the dummy pattern region 220. A second shading band 240 is formed outside the dummy pattern region 220.

Figure 6:
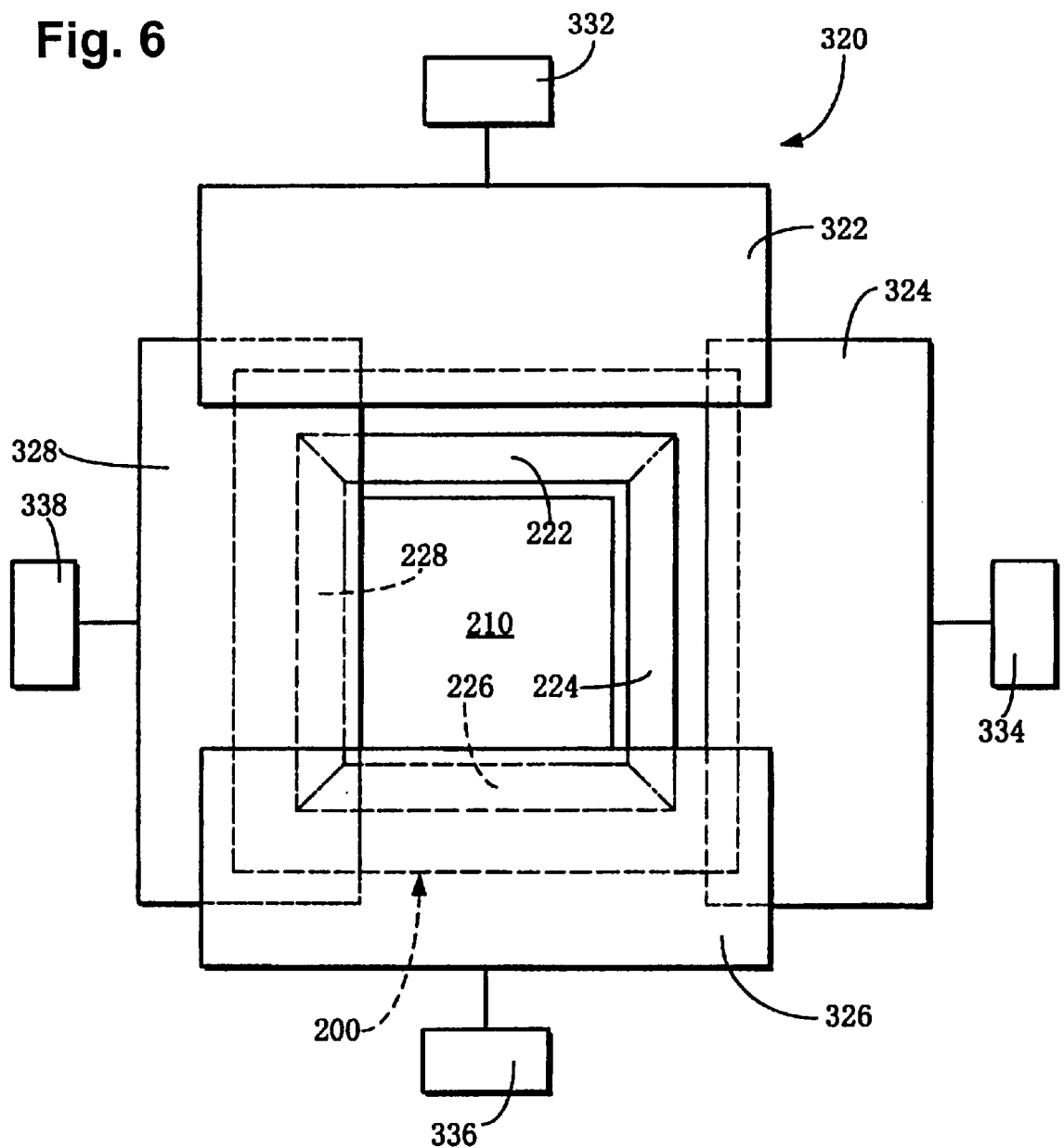
FIG. 6 shows a plan view illustrating positional relations between blinds and photomasks for exposing a region A10 in FIG. 4.
Figure 7:
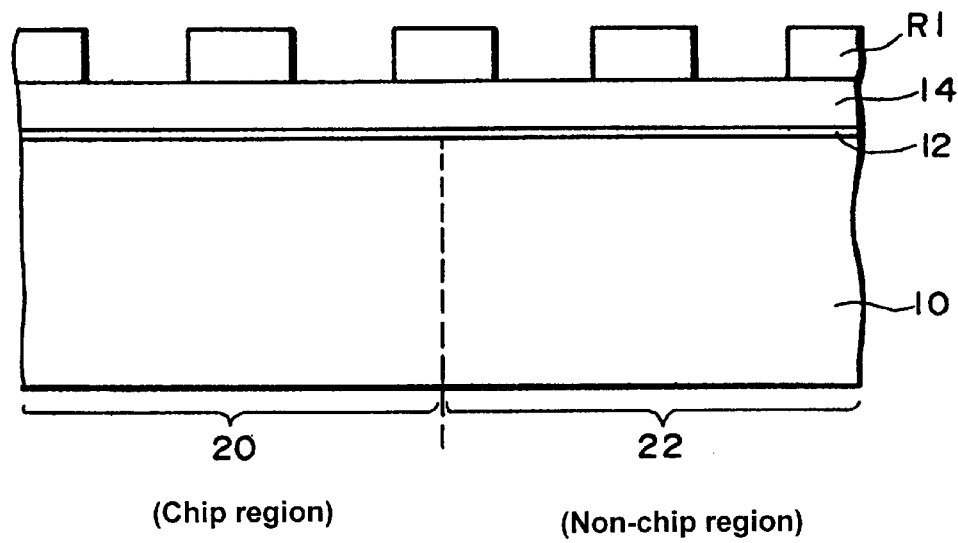
FIG. 7 schematically shows a cross-sectional view of a semiconductor wafer in the semiconductor wafer process step in accordance with the embodiment of the present invention.
Figure 7:
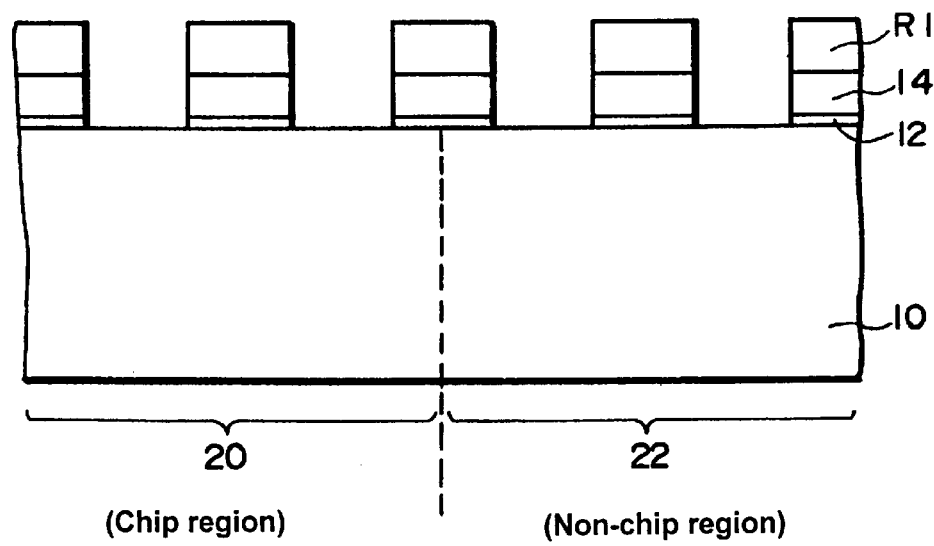
Figure 8:
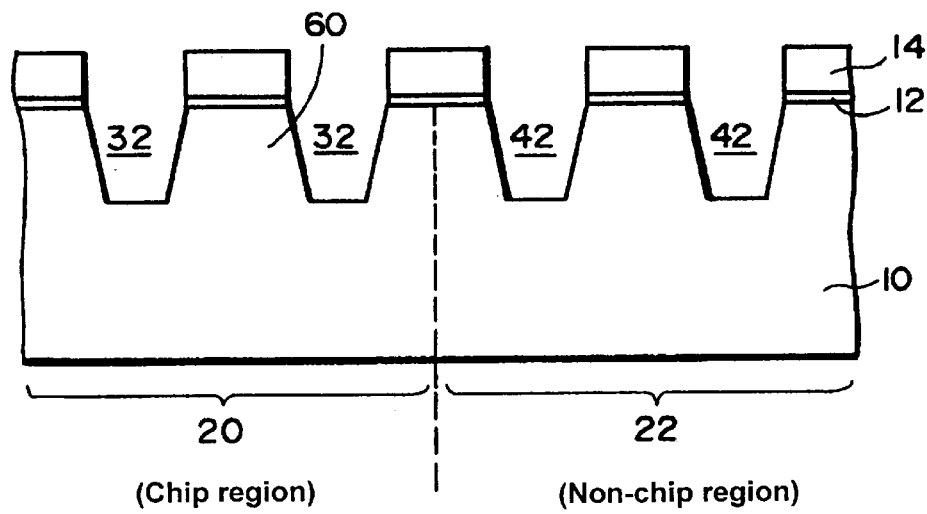
FIG. 8 schematically shows a cross-sectional view of a semiconductor wafer in the semiconductor wafer process step in accordance with the embodiment of the present invention.
Figure 8:
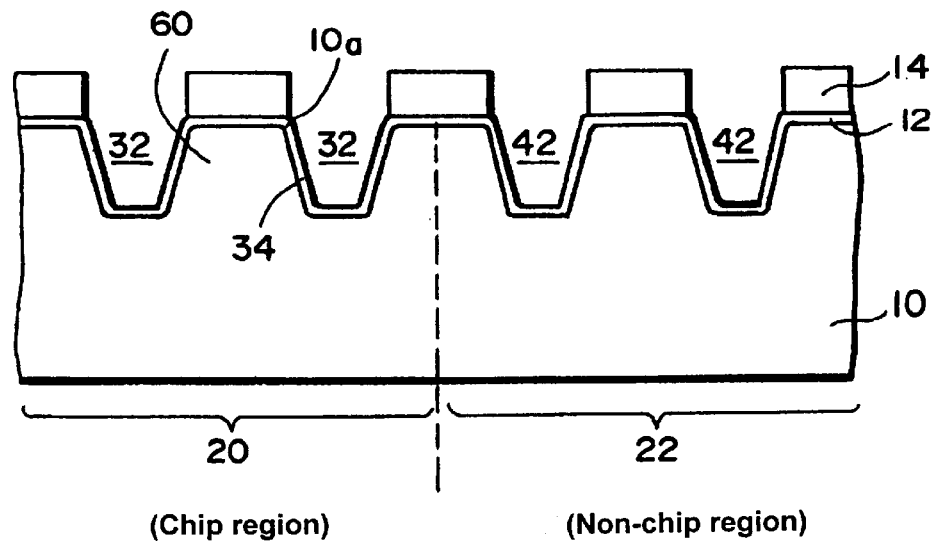
Figure 9:
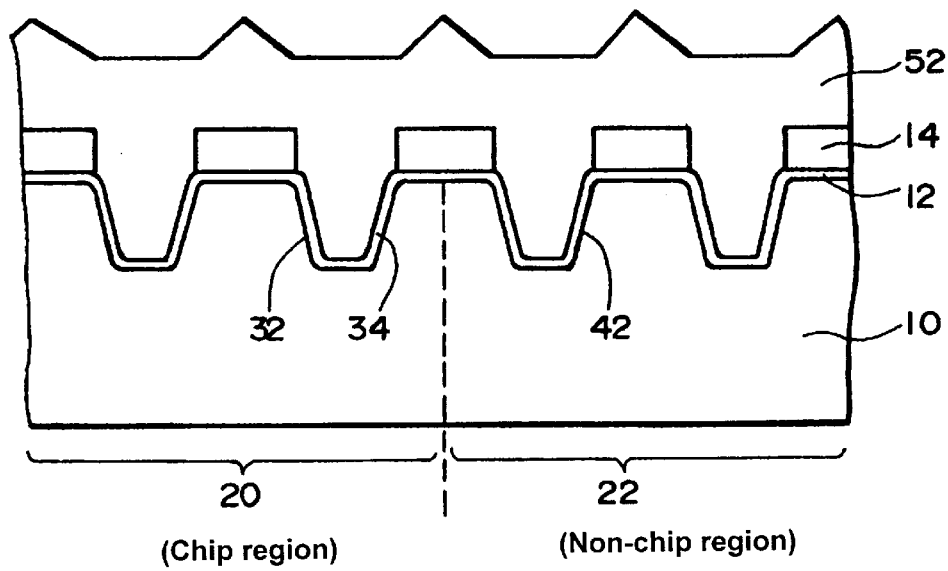
FIG. 9 schematically shows a cross-sectional view of a semiconductor wafer in the semiconductor wafer process step in accordance with the embodiment of the present invention.
Figure 9:
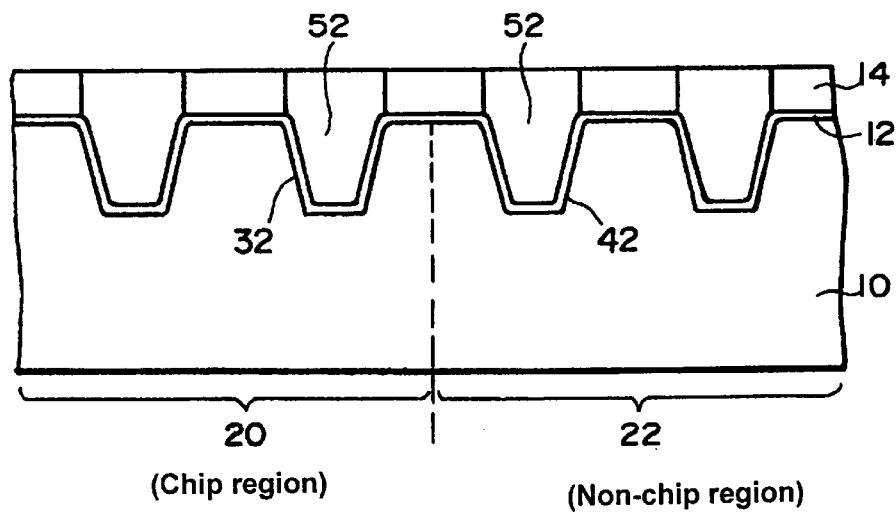

An example of exposure on the non-chip region using the photomask 200 is described below. One example of the exposing method in which a region A10 of the non-chip region in FIG. 4 is exposed is described below. When the photomask 200 is used for exposure, blinds are provided between a light source and the photomask 200. FIG. 6 is a plan view showing a positional relation between the blinds and the photomask when the region A10 is exposed.

The non-chip region 22 in the region A10 is simultaneously exposed at the time when the chip region 20 in the region A10 is exposed. In one embodiment, the chip region 20 and the non-chip region 22 are exposed in a manner described below.

Before the region A10 is exposed, a blind 320 that includes first through fourth moveable blinds 322, 324, 326 and 328 is controlled by first through fourth blind driving sections 332, 334, 336 and 338. More particularly, as shown in FIG. 6, the blind 320 is controlled such that the first and second dummy pattern sections 222 and 224 as viewed in plane are not covered by the first and second moveable blinds 322 and 324. In other words, the first and second dummy pattern sections 222 and 224 are opened. Also, the blind 320 is controlled such that the third and fourth dummy pattern sections 226 and 228 as viewed in plane are covered by the third and fourth moveable blinds 326 and 328. As a result, when the region A10 is exposed, the chip region 20 in the region A10 and the non-chip region 22 in the region A10 are simultaneously exposed. In other words, the pattern of the effective pattern region 210 is transferred onto the chip region 20 in the region A10, and at the same time, the pattern of the dummy patter region 220 is transferred onto the non-chip region 22. Exposure of other areas in the non-chip region 22 can be conducted in a similar manner as conducted for the region A10 only by controlling the blind 320.

In the exposure step using the photomask 200, the exposure of areas of the chip region 20 other than the area of the chip region 20 that is simultaneously exposed with the non-chip region 22 is conducted while the dummy pattern sections 222, 224, 226 and 228 are entirely covered.

Next, the resist layer R1 is developed to form the resist layer R1 having a specified pattern, as shown in FIG. 7(a).

(3) Then, as shown in FIG. 7(b), the polishing stopper layer 14 and the pad layer 12 are etched using the resist layer R1 as a mask. The etching may be conducted by, for example, a dry etching method.

(4) Next, as shown in FIG. 8(a), the resist layer R1 is removed. For example, the resist layer R1 may be removed by an ashing method. Then, the semiconductor wafer 10 is etched using the polishing stopper layer 14 as a mask to form trenches 32 and 42. More specifically, the trenches 32 are formed in the chip region 20 and the dummy trenches 42 are formed in the non-chip region 22. The depth of the trenches 32 and 42 may be different depending on device designs, but may be about 300—500 nm. The semiconductor wafer 10 may be etched by a dry etching method. Each of convex regions 60 formed between the trenches 32 and 42 may preferably have a tapered cross section. Because of reasons described below, the convex regions 60 with a tapered cross section facilitate embedding of a dielectric layer 52 in the trenches 32 and 42. The cross-sectional shape of each of the convex regions 60 has a taper angle α, which is preferably about 70 degree or greater but less than 90 degree.

Next, although not shown in the figures, end portions of the pad layer 12 between the silicon substrate 10 and the polishing stopper layer 14 are etched.

(5) Next, as shown in FIG. 8(b), exposed surfaces of the semiconductor substrate 10 in the trenches 32 and 42 are oxidized by a thermal oxidation method to thereby form a trench oxidation film 34. Since the end portions of the pad layer 12 are etched, shoulder sections 10a of the convex regions 60 are oxidized and rounded by the thermal oxidation. For example, the trench oxide layer 34 may have a film thickness of about 10–70 nm, and more preferably 10–50 nm.

(6) Next, as shown in FIG. 9(a), a dielectric layer 52 is deposited over the entire surface of the semiconductor substrate in a manner to embed the trenches 32 and 42 with the dielectric layer 52. The dielectric layer 52 may be formed from, for example, silicon oxide. The thickness of the dielectric layer 52 is not limited to a particular range as long as the thickness of the dielectric layer 52 is sufficient to embed the trenches 32 and 42 and cover at least the polishing stopper layer 14. For example, the dielectric layer 52 may have a film thickness of 500–800 nm. The dielectric layer 52 may be deposited by, for example, a high-density plasma CVD (HDP—CVD) method, a thermal CVD method, a TEOS plasma CVD method or the like.

The following effects are obtained in the deposition of the dielectric layer 52. Since the dummy trenches 42 are formed in the non-chip region 22, a wide convex section is not formed in the non-chip region 22 adjacent to the chip region 20. As a result, the dielectric layer 52 is prevented from being thickly deposited in the non-chip region 22 adjacent to the chip region 20.

(7) Next, as shown in FIG. 9(b), the dielectric layer 52 is planarized by a CMP method. The planarization is conducted until the polishing stopper layer 14 is exposed. In other words, the dielectric layer 52 is planarized using the polishing stopper layer 14 as a stopper.

The following effects are obtained in the planarization step. If the dielectric layer 52 deposited over the non-chip region 22 is substantially thick, the dielectric layer 52 may remain after the polishing of the dielectric layer 52, in outermost regions of the chip region 20 over the polishing stopper layer 14 due to the presence of the thick dielectric layer 52 deposited over the non-chip region 22. However, in the present embodiment, the dielectric layer 52 is prevented from being thickly deposited in the non-chip region 22, as described above. As a result, the dielectric layer is substantially prevented from remaining in the outermost regions of the chip region 20 over the polishing stopper layer 14.

Furthermore, when an isolated convex section is present in the chip region 20, the removal of the polishing stopper layer 14 at the isolated convex section is substantially suppressed when the dielectric layer 52 is polished. In other words, the occurrence of thinning of the polishing stopper layer 14 at the isolated convex section is suppressed. Also, the occurrence of dishing in an upper portion of the dielectric layer 52 is suppressed.

Figure 10:
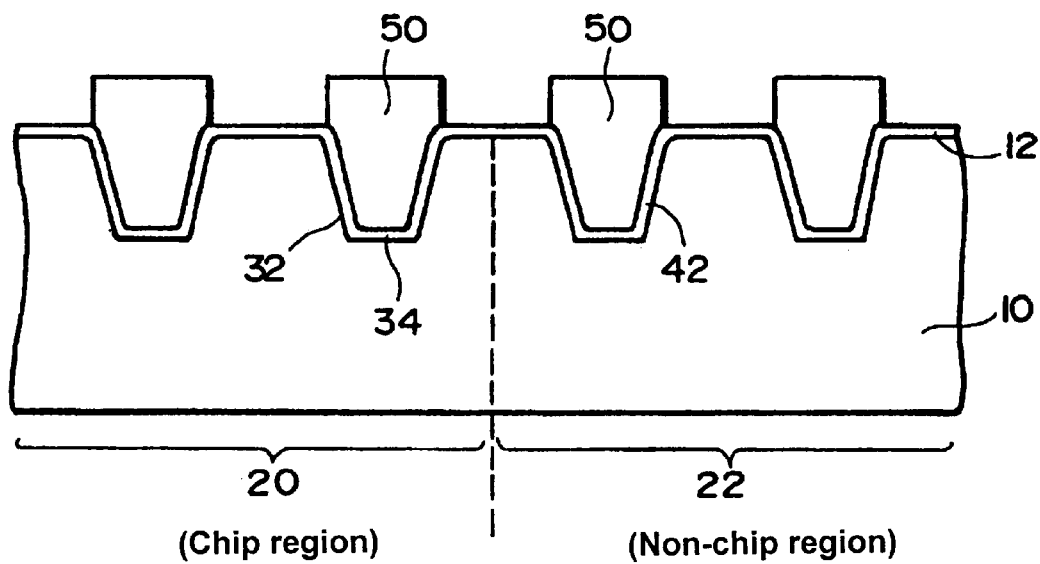
FIG. 10 schematically shows a cross-sectional view of a semiconductor wafer in the semiconductor wafer process step in accordance with the embodiment of the present invention.

(8) Next, as shown in FIG. 10, the polishing stopper layer 14 is removed using, for example, a heated phosphoric acid solution. Since the dielectric layer 52 is suppressed from remaining over the polishing stopper layer 14 in the chip region 20, the removal of the polishing stopper layer 14 is securely conducted.

Next, as shown in FIG. 2, the pad layer 12 and upper portions of the dielectric layer 52 are isotropically etched by hydrofluoric acid. In this manner, the trench dielectric layers 50 are formed in the trenches 32, and the trench isolation region 30 is completed in the chip region 20. Also, at the same time, the trench dielectric layers 50 are formed in the dummy trenches 42, and the trench isolation region 40 is completed in the non-chip region 22.

The following effects are obtained by the method for processing a semiconductor wafer in accordance with the embodiment of the present invention described above.

(a) In the present embodiment, the dummy trenches 42 are formed in the non-chip region 22. As a result, the dielectric layer 52 is prevented from being thickly deposited over the polishing stopper layer 14 in the non-chip region 22 compared to the dielectric layer 52 in the chip region 20. If the dielectric layer 52 deposited over the non-chip region 22 is substantially thick, the dielectric layer 52 may remain, after the polishing of the dielectric layer 52, in outermost regions of the chip region 20 over the polishing stopper layer 14 due to the presence of the thick dielectric layer 52 deposited over the non-chip region 22. However, in the present embodiment, the dielectric layer 52 is substantially prevented from being thickly deposited in the non-chip region 22. As a result, the dielectric layer 52 is substantially suppressed from remaining in the outermost regions of the chip region 20 over the polishing stopper layer 14. In other words, the uniformity within the surface of the dielectric layer 52 is improved in the outermost regions of the chip region 20. Therefore, the yield of chips that are formed in the outermost regions of the chip regions is improved.

(b) When the dummy trenches 42 are formed in a region extending outwardly by 1.5 mm or greater from the boundary B10 between the chip region 20 and the non-chip region 22, the following effects are obtained. Namely, the dielectric layer 52 is substantially prevented from remaining over the polishing stopper layer 14 in the chip region 20 adjacent to the non-chip region 22. Therefore, the yield of chips that are formed in the chip region 20 adjacent to the non-chip region 22 is improved.

When the dummy trenches 42 are formed in a region extending outwardly by 2 mm or greater from the boundary B10 between the chip region 20 and the non-chip region 22, the following effects are obtained. Namely, the dielectric layer 52 is more securely prevented from remaining over the polishing stopper layer 14 in the chip region 20 adjacent to the non-chip region 22.

(c) When the dummy trenches 42 are formed in a region that extends outwardly by 5 mm or less from the boundary B10 between the chip region 20 and the non-chip region 22, the following effects are obtained. When semiconductor wafers are transported, or semiconductor wafers are placed in a variety of apparatuses, each of the semiconductor wafers is retained by using a region of the semiconductor wafer that inwardly extends by 5 mm from the edge of the semiconductor wafer (hereafter referred to as a "retaining region of a semiconductor wafer"). The chip region 20 is set in a region inside the retaining region of the semiconductor wafer. When the dummy trenches 42 are formed in a region that extends outwardly by 5 mm or less from the boundary B10 between the chip region 20 and the non-chip region 22, a region for forming the dummy trenches 42 can be set only within the retaining region of the semiconductor wafer. In other words, the non-chip region 22 can be formed only with the retaining region of the semiconductor wafer. As a result, the chip region 20 is effectively set on the semiconductor wafer.

(d) When the non-chip region 22 is exposed using the photomask 200 shown in FIG. 5, the chip region 20 can also be simultaneously exposed. As a result, the non-chip region 22 can be exposed without lowering the throughput of the exposure step.

(e) When the non-chip region 22 is exposed in a region outwardly extending by about 2 mm from the boundary B10 between the chip region 20 and the non-chip region 22, a region for forming patterns such as printed letters can be sufficiently secured.

The semiconductor wafer processed in the manner described above is subject to further process steps to form, for example, semiconductor elements (for example, MOS elements and wiring layers) in the element forming regions. The semiconductor wafer in which semiconductor elements are formed is subjected to a dicing step to form chips.

Experiments are conducted to see how the exposure on the non-chip region makes differences in the thickness of the dielectric layer that remains over the polishing stopper layer in a boundary region between the chip region and the non-chip region after the dielectric layer is polished. For the experiments, two types of samples are made. A sample that is subject to an exposure on the non-chip region is referred to in this specification as an "embodiment sample" and a sample that is not subject to an exposure on the non-chip region is referred to as a "comparison sample".

In the embodiment sample, an exposure is conducted on a non-chip region adjacent to a chip region to form dummy trench isolation regions in the non-chip region. The exposure on the non-chip region is conducted within a region extending by 2 mm into the non-chip region from the boundary between the chip region and the non-chip region. Also, the exposure on the non-chip region is performed at a location that is 0.1 mm away from the boundary between the chip region and the non-chip region in order to secure the scribe lines.

Figure 11:
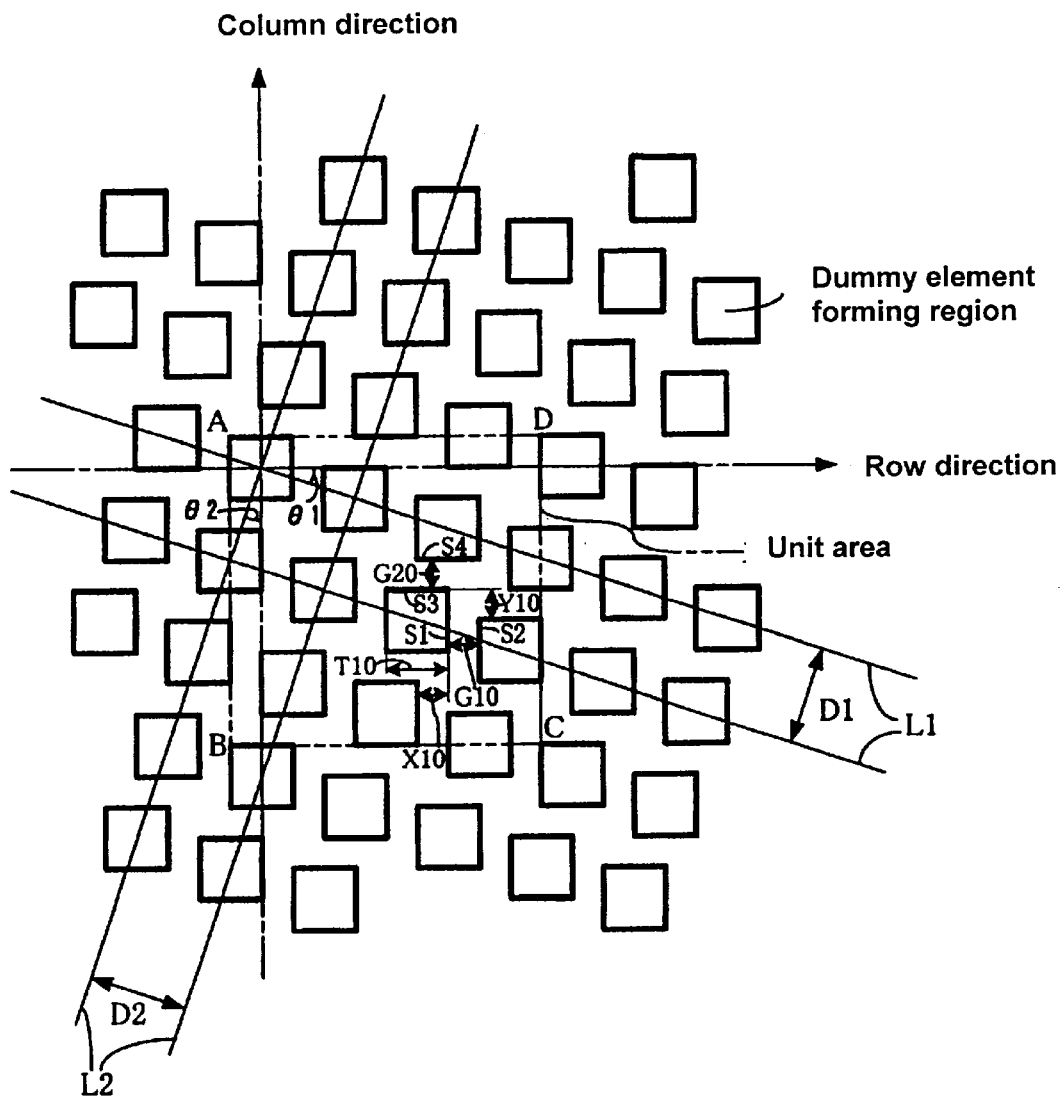
FIG. 11 shows a plan view of a pattern of disposed dummy element forming regions.

Also, the exposure on the non-chip region is performed in a manner that dummy element forming regions are formed under conditions described below. FIG. 11 shows a plan view of a pattern of the disposed dummy element forming regions.

(a) First virtual linear lines L1 that extend in a direction traversing a row direction are defined, and the dummy element forming regions are disposed such that centers thereof are located on the first virtual linear lines L1.

(b) Second virtual linear lines L2 that extend in a direction traversing a column direction are defined, and the dummy element forming regions are disposed such that centers thereof are located on the second virtual linear lines L2.

(c) An angle θ1 between the first virtual linear lines and the row line is about 18.4 degree.

(d) A distance D1 between adjacent ones of the first virtual linear lines is about 3.2 μm.

(e) An angle θ2 between the second virtual linear lines and the column line is about 18.4 degree.

(f) A distance D2 between adjacent ones of the second virtual linear lines is about 3.2 μm.

(g) A ratio of an area of the dummy element forming regions occupied in a unit area (which is a rectangular area defined by points A, B, C and D in FIG. 11) is 40%.

(h) A shape of each of the dummy element forming regions in plan view is square.

(i) Each side of each of the dummy element forming regions in plan view has a length of 2 μm.

(j) A gap G10 between opposing sides of adjacent ones of the dummy element forming regions disposed on the same one of the first virtual linear lines is 1 μm.

(k) A gap G20 between opposing sides of adjacent ones of the dummy element forming regions disposed on the same one of the second virtual linear lines is 1 μm.

(l) An off set width Y10 in the column direction between opposing sides of adjacent ones of the dummy element forming regions disposed on the same one of the first virtual linear lines is 1 μm.

(m) An off set width X10 in the row direction between opposing sides of adjacent ones of the dummy convex regions disposed on the same one of the second virtual linear lines is 1 μm.

Figure 12:
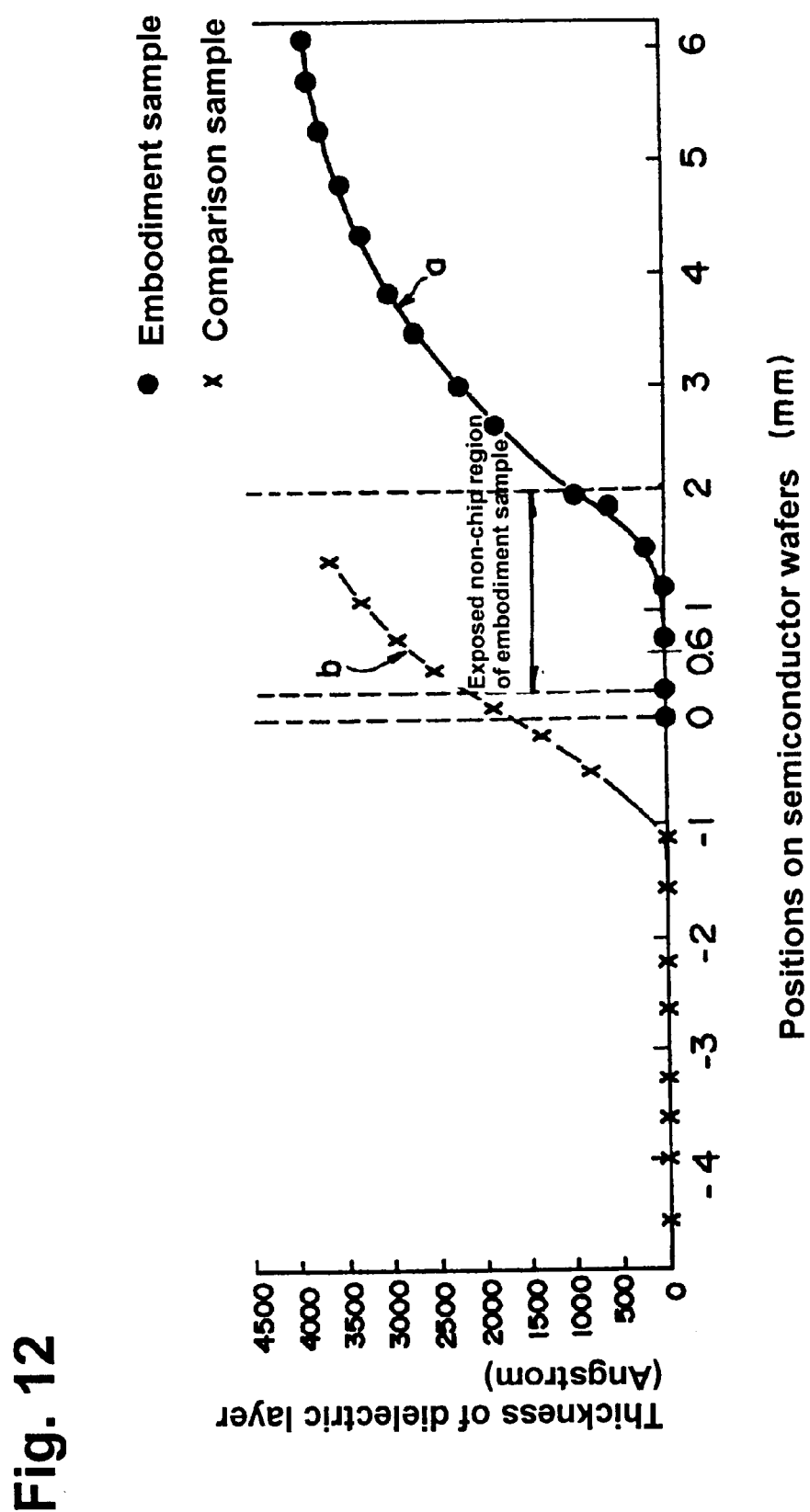
FIG. 12 is a graph showing a distribution of thickness of a dielectric layer that remains over a polishing stopper layer in each of an embodiment sample and a comparison sample.
Figure 13:
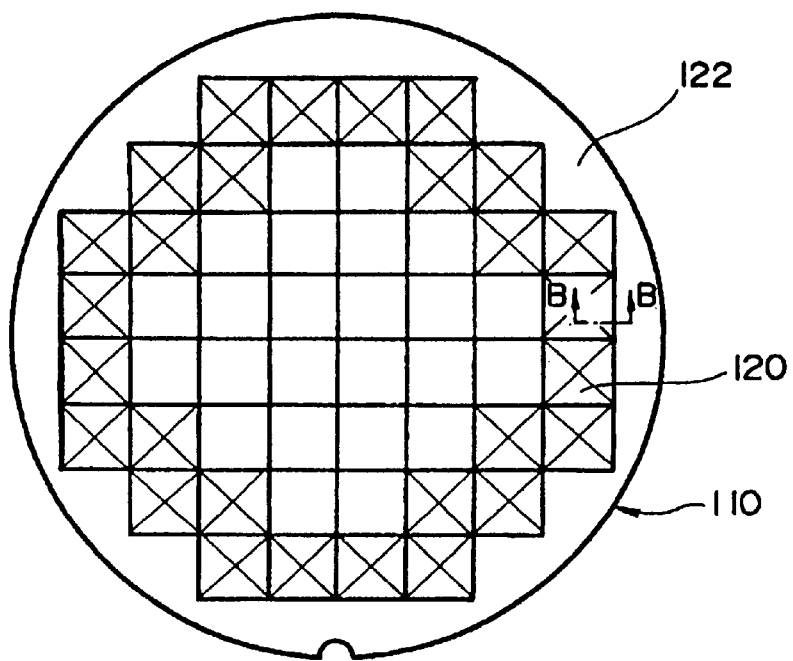
FIG. 13 shows a plan view of a semiconductor wafer over which a pad layer, a polishing stopper layer and a resist layer are successively deposited, which is used to describe an exposure area in which the resist layer formed over the semiconductor wafer is exposed.

FIG. 12 is a graph showing distributions of thickness of the dielectric layer that remains over the polishing stopper layer in each of the embodiment sample and the comparison sample. The reference point 0 shown in the graph is a boundary point between the chip region and the non-chip region. Negative side (on the left side) of the reference point 0 indicates the chip region, and positive side (on the right side) of the reference point 0 indicates the non-chip region. The thickness of the dielectric layer is measured from an upper surface of the polishing stopper layer. Reference a indicates a graph obtained from data of the embodiment sample, and reference b indicates a graph obtained from data of the comparison sample.

In the comparison sample, the dielectric layer remains over the polishing stopper layer at the reference point 0. In contrast, in the embodiment sample, the dielectric layer does not remain over the polishing stopper layer at the reference point 0. Accordingly, it is confirmed that a dummy shot (an exposure in the non-chip region) improves the uniformity within the surface of the dielectric layer in the chip region adjacent to the non-chip region.

Also, the following aspect is also confirmed from FIG. 12. When the dummy shot is performed, any dielectric film does not remain in a region outside a range extending from a boundary in the non-chip region between an exposed non-chip region and a non-exposed non-chip region by 1.4 mm (in other words, in a region extending by 0.6 mm or less from a boundary between the chip region and the non-chip region in the semiconductor wafer). Accordingly, it is confirmed that, when the exposure on the non-chip region is conducted within a region extending from the reference point 0 into the non-chip region by 1.5 mm, the dielectric layer does not remain in the outermost regions in the chip region adjacent to the non-chip region over the polysilicon layer when the polishing of the dielectric layer in the chip region is completed.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A semiconductor wafer having a chip region and a non-chip region, the semiconductor wafer comprising:
    dummy trench isolation regions in at least a part of the non-chip region, wherein the dummy trench isolation regions are formed in a region extending by a specified distance into the non-chip region from a boundary between the chip region and the non-chip region.

2. A semiconductor wafer according to claim 1, wherein the specified distance is 1.5 mm or greater.

3. A semiconductor wafer according to claim 1, wherein the specified distance is between 2 mm and 5 mm.

4. A semiconductor wafer comprising:
    a chip region where chips can be formed on the wafer according to a given pattern;
    a non-chip region where chips cannot be formed according to the given pattern
    dummy trench isolation regions in at least a part of the non-chip region;

wherein the dummy trench isolation regions are offset from a boundary between the chip region and the non-chip region by a specified distance.

5. A semiconductor wafer according to claim 4, wherein the specified distance is 1.5 mm or greater.

6. A semiconductor wafer according to claim 4, wherein the specified distance is between about 2 mm and about 5 mm.

* * * * *

UNITED STATES PATENT AND TRADEMARK OFFICE
CERTIFICATE OF CORRECTION

PATENT NO. : 6,518,633 B2
DATED : February 11, 2003
INVENTOR(S) : Katsumi Mori and Kenji Kojima It is certified that error appears in the above-identified patent and that said Letters Patent is hereby corrected as shown below:

Column 2,
Line 10, delete "word" and substitute -- words -- therefore
Line 15, delete "a" and substitute -- an -- therefore Column 8,
Line 25, delete "patter" and substitute -- pattern -- therefore Column 12,
Line 65, after "pattern" insert a semicolon Signed and Sealed this Seventh Day of October, 2003

JAMES E. ROGAN
*Director of the United States Patent and Trademark Office*